United States Patent
Ilkbahar et al.

Patent Number: 5,869,983
Date of Patent: Feb. 9, 1999

[54] METHOD AND APPARATUS FOR CONTROLLING COMPENSATED BUFFERS

[75] Inventors: Alper Ilkbahar, Santa Cruz; Stefan Rusu, Sunnyvale, both of Calif.

[73] Assignee: Intel Corporation, Santa Clara, Calif.

[21] Appl. No.: 823,220

[22] Filed: Mar. 24, 1997

[51] Int. Cl.⁶ .............................................. H03K 19/0175
[52] U.S. Cl. ................................. 326/83; 326/32; 327/407
[58] Field of Search .................... 326/32–34, 82, 326/83, 87; 327/407, 408, 94

[56] References Cited

U.S. PATENT DOCUMENTS

| | | | |
|---|---|---|---|
| 4,975,598 | 12/1990 | Borkar | 326/32 |
| 5,063,308 | 11/1991 | Borkar | 326/26 |
| 5,306,965 | 4/1994 | Asprey | 326/83 |
| 5,528,166 | 6/1996 | Ikbahar | 326/27 |
| 5,736,867 | 4/1998 | Keiser et al. | 326/82 |

OTHER PUBLICATIONS

Donnelly KS et al.: A 660 MB/s Interface Megacell Portable Circuit in 0.3 μm CMOS ASIC, IEEE J of Solid–State Circuits, vol. 31(12): Dec. 1996.

Gabara TJ et al.: Forming Damped LRC Parasitic Circuits in Simultaneously Switched CMOS Output Buffers, IEEE J of Solid–State Circuits, vol. 32(3), Mar. 1997.

*Primary Examiner*—Jon Santamauro
*Assistant Examiner*—Don Phu Le
*Attorney, Agent, or Firm*—Blakely, Sokoloff, Taylor & Zafman LLP

[57] ABSTRACT

A method and an apparatus for controlling compensated buffer circuits. In one embodiment, a compensation buffer control circuit includes a compensation unit with a compensation signal memory location such as a compensation register. The compensation unit is configured to produce a local compensation control signal to control a compensated buffer circuit. The compensation signal memory location is configured to selectively receive and store and the local compensation control signal generated by the compensation unit. The contents of the compensation signal memory location may be read, which allows for the external reading of the local compensation signal generated by the compensation unit. In addition, an external write of an external compensation control signal may be performed to the compensation signal memory location such that the output of the compensation unit can be overridden. A compensated buffer circuit is coupled to selectively receive either the local compensation control signal or the external compensation control signal.

14 Claims, 2 Drawing Sheets

METHOD AND APPARATUS FOR CONTROLLING COMPENSATED BUFFERS

RELATED APPLICATIONS

This application is related to co-pending application Ser. No. 08/842,066, filed Mar. 24, 1997, entitled, "Method and Apparatus of Slew Rate and Impedance Compensating Buffer Circuits," and assigned to the assignee of the present invention.

This application is also related to co-pending application Ser. No. 08/823,215, filed Mar. 24, 1997, entitled, "Method and Apparatus for Testing Compensated Buffer Circuits," and assigned to the assignee of the present invention.

BACKGROUND OF THE INVENTION

1. Field of the Invention

The present invention relates generally to integrated circuit technology and, more specifically, the present invention relates to compensated integrated circuit buffers.

2. Description of the Related Art

To achieve high performances in modern integrated circuits, it is often necessary to utilize high speed buffer circuits such as for example input/output buffers. Integrated circuits generally interface with the high speed busses with input/output buffers. As integrated circuit technology continue to advance, the frequencies at which the integrated circuits operate increase accordingly. It has been a considerable challenge for circuit designers to design busses that are able to match the speed performance of the core speed of modern central processing units (CPUs). One reason for the difficulty of continuously increasing bus speeds to match the continuously increasing CPU core speeds is that input/output buffers coupled to the busses must often operate across a wide variety of operating conditions. For instance, the performance of an input/output buffer changes with respect to conditions such as process, voltage and temperature.

The use of impedance compensated input/output buffers have provided one prior art solution to the problems associated with the changes in operating conditions such as process, voltage and temperature. Impedance compensated input/output buffers address the problems associated with varying conditions by providing mechanisms to help maintain the optimum characteristics of input/output buffer drivers over a wide range of operating conditions.

FIG. 1 is an illustration of a prior art impedance compensated input/output buffer 101 that employs digital impedance compensation, which relies basically on the same principles as an analog-to-digital converter. In this scheme, input/output buffer 101 includes compensation devices, which are shown as a plurality of transistors 107A–C coupled in parallel between an output pin 113 and ground. Compensation unit 121 generates digital information via signals 111A–C, which indicate the number of parallel coupled transistors 107A–C in every buffer that should be activated at a given time to compensate for varying operating conditions.

For example, under slow operating conditions, which include low voltage, high temperature and slow process corner, many transistors 107A–C may need to be activated to pole the voltage at the output pin 113 to ground. In contrast, under faster operating conditions, fewer parallel coupled transistors 107A–C may need to be switched on for similar performance.

Although prior art input/output buffer 101 has the ability to compensate for varying operating conditions, one limitation of input/output buffer 101 is that it is difficult to verify the proper functionality of compensation unit 121 and parallel coupled transistors 109A–C since the parallel coupled transistors 109A–C create logic redundancies. Specifically, transistors 109A–C are coupled and parallel between node 119 and ground. For optimum performance, it is desired that all transistors 109A–C are completely functional. There is the possibility that in a testing environment, one or more of the parallel coupled devices 109A–C may not function properly due to a defect, but the remaining devices could still function properly. A tester (not shown) coupled to output pin 113 and node 119 would be unable to detect a defective device based on logic levels or simple timing. As a consequence, the defective device may not be detected in a testing environment but could, however, cause input/output buffer 101 to fail in a system environment.

Another limitation of compensation unit 121 is that if it is desired to deliberately adjust the control signals 111A–C to adjust the characteristics of compensated input/output buffer 101, it is generally necessary to precisely adjust or vary the resistance of resistor R1 or reference voltage $V_{REF}$ 117. It is appreciated that the need to carefully and precisely adjust the resistance of resistor R1 or the value of reference voltage $V_{REF}$ 117 may be a relatively difficult and tedious task for an integrated circuit designer that desires to adjust the control signals 111A–C generated by compensation unit 121.

Therefore, what is desired is a method and an apparatus for controlling a compensated buffer. Such a method and apparatus would provide improved control of the compensation unit output signals without the need of precisely adjusting or varying the reference resistor or voltage values coupled to the compensation units. Such a method and apparatus would also provide enhanced observability of a compensation unit of a compensated buffer to facilitate the testing of the logic redundancies created by the parallel coupled nature of the devices of compensated input/output buffers.

SUMMARY OF THE INVENTION

A method and an apparatus for controlling a compensated buffer circuit is described. In one embodiment, a compensated buffer control circuit includes a compensation unit configured to generate a compensation control signal for controlling the compensated buffer circuit. A compensation signal memory location is coupled to the compensation unit and is also coupled to receive and store an external compensation control signal. A selection circuit coupled to the compensation unit and the compensation signal memory location is configured to select between the local compensation control signal generated by the compensation unit and the external compensation control signal stored in the compensation signal memory location such that the selection circuit generates an output compensation control signal that is coupled to be received by the compensated buffer circuit. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

DETAILED DESCRIPTION

A method and an apparatus for controlling a compensated buffer circuit is disclosed. In the following description numerous specific details are set forth in order to provide a thorough understanding of the present invention. It will be apparent, however, to one having ordinary skill in the art that the specific detail need not be employed to practice the present invention. In other instances, well known materials or methods have not been described in detail in order to avoid obscuring the present invention.

Control of compensated buffer circuits is achieved with the present invention with the addition of a compensation signal memory location, such as for example a compensation register, coupled to a compensation unit of a compensated buffer circuit. This aspect of the present invention provides enhanced observability of the output control signals of the compensation unit since the contents of the compensation register can be externally read. This enhanced observability enables convenient monitoring of the compensation unit outputs and therefore facilitates testing of the compensation unit. In addition, the disclosed compensation register may be externally loaded with an external compensation control signal. As a result, the contents of the disclosed compensation register may be selectively used to override the outputs of the compensation unit. This aspect of the present invention enables external control of compensated buffer circuits without the need of having to precisely adjust the reference resistor or reference voltages coupled to the compensation unit for external control of the compensation unit. Moreover, this aspect of the present invention may facilitate testing of individual compensation devices in compensated buffers controlled by the compensation register.

Figure 1:
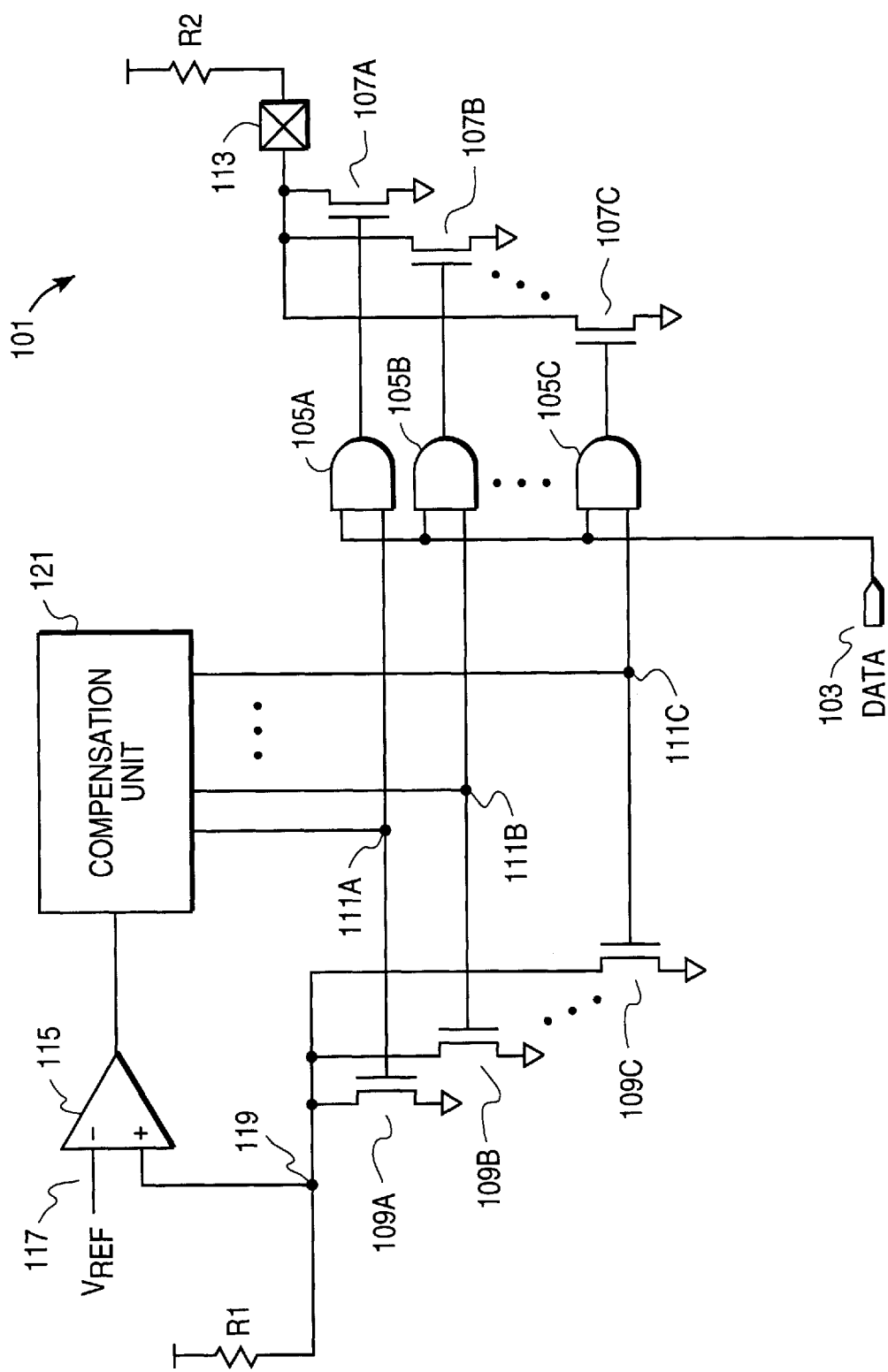
FIG. 1 is a schematic of a prior art compensated buffer circuit with a compensation unit generating control signals to control the compensated buffer circuit.
Figure 2:
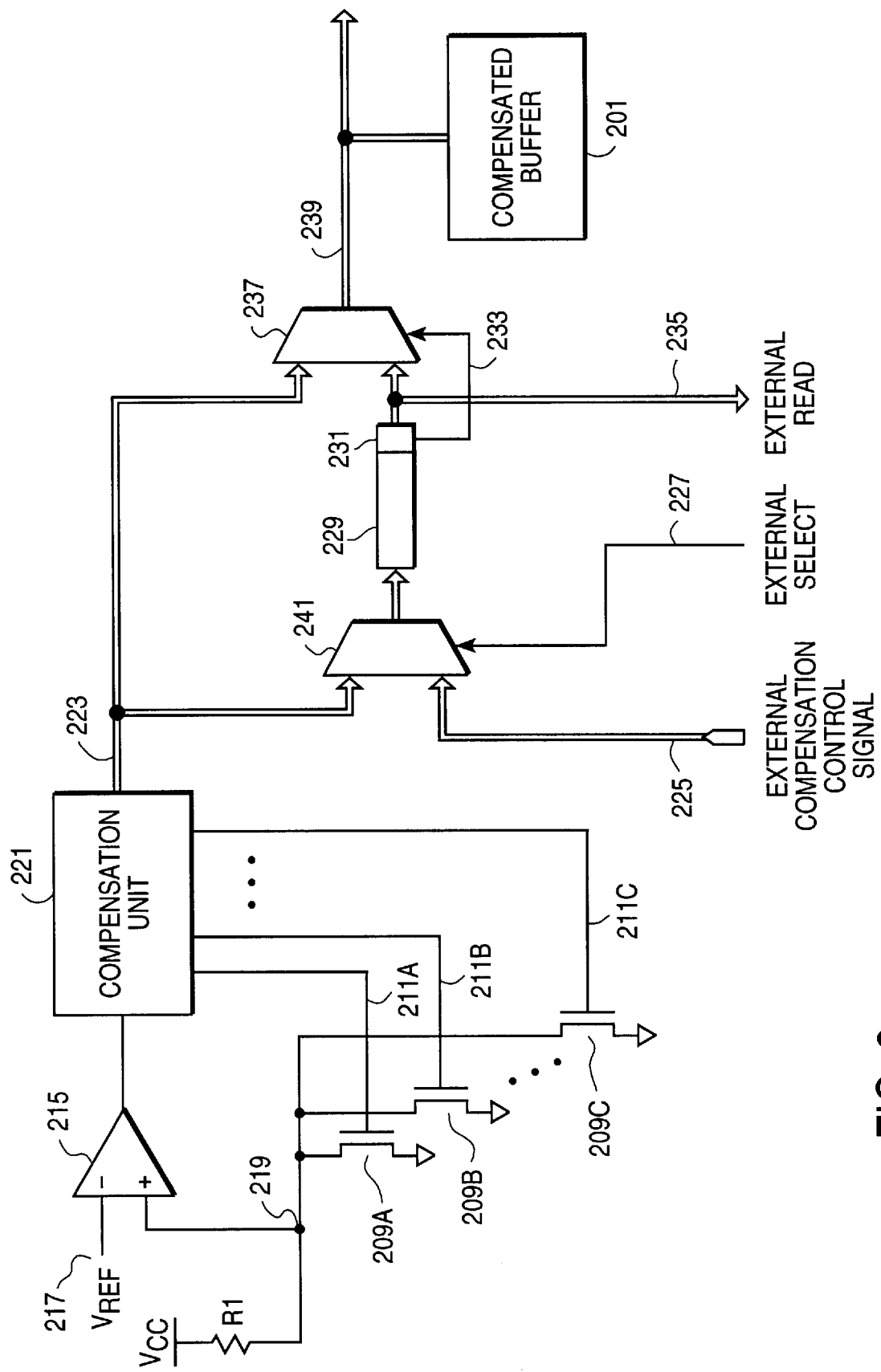
FIG. 2 is a block diagram of a compensated buffer control circuit including a compensation signal memory location in accordance with the teachings of the present invention.

FIG. 2 is a block diagram of a compensation buffer control circuit in accordance with the teachings of the present invention. As shown in FIG. 2, the compensation buffer control circuit includes a compensation unit 221, which generates local compensation control signal 223 that may be used to control a compensated buffer 201. Transistors 209A–C are coupled in parallel between resistor R1 and ground. Comparator 215 has one input coupled to receive $V_{REF}$ 217 and another input coupled to node 219, which is located between resistor R1 and the plurality of parallel coupled transistors 209A–C. The output of comparator 215 is received by compensation unit 221 which generates the local compensation control signal 223 used to control compensated buffer 201.

Multiplexor 241 is coupled to receive local compensation control signal 223 and an external compensation control signal 225. Multiplexor 241 selects either local compensation control signal 223 or external compensation control signal 225 in response to an external select signal 227. Multiplexor 241 outputs the selected compensation control signal, which is then received and stored in a compensation signal memory location 229.

In one embodiment of the present invention, both local compensation control signal 223 and external compensation control signal 225 include a plurality of digital signals. Each one of the plurality of digital signals in local compensation control signal 223 and external compensation control signal 225 may be used to control a corresponding compensation device (not shown) included in compensated buffer 201. Accordingly, compensation signal memory location 229 includes a plurality of bit storage locations, each of which is configured to store corresponding individual bits of either local compensation control signal 223 or external compensation control signal 225.

Multiplexor 237 is coupled to receive the contents of compensation signal memory location 229 and the local compensation control signal 223 generated by compensation unit 221. In one aspect of the present invention, one bit of the local compensation control signal 223 and the external compensation control signal 225 is used by multiplexor 237 to indicate whether compensated buffer 201 is to receive the local compensation control signal 223 output by compensation unit 221 or the external compensation control signal 225. This bit is stored in bit 231 of compensation signal memory location 229. Accordingly, bit 231 of compensation signal memory location 229 is coupled to multiplexor 237 as shown in FIG. 2. Multiplexor 237 correspondingly generates the output compensation control signal 239, which is received by compensated buffer 201. As shown in FIG. 2, output compensation control signal 239 is coupled to be received by compensated buffer 201.

An external read signal line 235 is coupled to the compensation signal memory location 229 to allow external reads of the contents of compensation signal memory location 229. Accordingly, if compensation signal memory location 229 is loaded with the local compensation control signal 223 per external select signal 227, the local compensation control signal 223 may be observed by reading the contents of compensation signal memory location 229. As will be discussed, observability of the contents of compensation signal memory location 229 facilitates improved testing of compensation unit 221.

In operation, compensation unit 221 and comparator 215 act as an analog-to-digital converter as comparator 215 compares the voltage at $V_{REF}$ 217 with the voltage at node 219. The output of comparator 215 is received by compensation unit 221, which selectively switches on and off each one of the parallel coupled transistors 209A–C until the voltage at node 219 is equal to the voltage at $V_{REF}$ 217. Local compensation control signal 223 is generated by compensation unit 221 based on the number of transistors 209A–C that are switched on or off.

In one embodiment of the present invention, external reads of compensation signal memory location 229 through external read signal line 235 may be used to test proper functionality of transistors 209A–C. One method for testing transistors 209A–C is achieved by initially setting $V_{REF}$ 217 at a potential equal to Vcc. If compensation unit 221 is functioning properly, all transistors 209A–C will be switched off with signals 211A–C in order to bring the voltage at node 219 up to Vcc. Assuming compensation unit 221 and parallel coupled transistors 209A–C are functioning properly, the appropriate corresponding local compensation control signal 223 will be generated by compensation unit 221. The value of local compensation control signal 223 may be selected by multiplexor 241 with the appropriate external select signal 227 such that local compensation control signal 223 is received by an stored in compensation signal memory location 229. An external read of the contents of compensation signal memory location 229 may be accomplished through external read signal line 235 to verify that the proper local compensation control signal 223 has been generated by compensation unit 221.

Next, $V_{REF}$ 217 may then be incrementally decremented in potential such that each one of the plurality of transistors 209A–C are switched accordingly to match the voltage at node 219 with the particular voltage at $V_{REF}$ 217 at a particular time. The contents of compensation signal memory location 229 may then be checked for each setting of $V_{REF}$ 217 to verify that compensation unit 221 generates the proper local compensation control signal 223 for each setting of $V_{REF}$ 217. Thus, by reading the contents of the compensation signal memory location 229, proper functionality of compensation unit 221 and parallel coupled transistors 209A–C may be verified in accordance with the teachings of one aspect of the present invention.

As discussed above, it is also appreciated that compensation signal memory location 229 loaded through external writes in accordance with another aspect of the present invention. By allowing external writes into compensation signal memory location 229, the outputs of compensation unit 221 may therefore be overridden to provide external control of the characteristics of compensated buffer 201 independent of the compensation unit 221. That is, by loading the compensation signal memory location 229 with external compensation control signal 225 and selecting the external compensation control signal 225 with external select signal 227 and bit 231, the local compensation control signal 223 may be overridden in accordance with another aspect of the present invention.

In one embodiment of the present invention, compensated buffer 201 is an input/output buffer with compensation control of slew rate as well as impedance. In that embodiment, local compensation control signal 223 and external compensation control signal 225 both include corresponding bits to control the slew rate or impedance compensation devices (not shown) included in compensated buffer 201. One embodiment that includes compensated buffer 201 having slew rate and impedance compensation control is described in greater detail in co-pending application Ser. No. 08/824,066, filed Mar. 24, 1997, entitled, "Method and Apparatus for Slew Rate and Impedance Compensating Buffer Circuits," and assigned to the assignee of the present invention.

In accordance with the teachings of the present invention, skew may be deliberately added or removed from compensated buffer 201 in instances where compensated buffer 201 includes slew rate compensation circuitry. In particular, skew or delay may be deliberately added by controlling compensated buffer 201 to produce output signals with increased slew rates. With increased slew rates, the rise and fall times of the signals output by compensated buffer 201 are increased accordingly. As a result, longer periods of time lapse before receivers (not shown) coupled to compensation buffer 201 switch in response to output signals of compensation buffer 201. These delays in switching correspond to the longer periods of time required for the input threshold levels of the receivers to be reached due to the increased rise and fall times of compensation buffer 201.

In embodiments where compensated buffer 201 includes impedance compensation control circuitry, the present invention may be used to deliberately increase or decrease the output impedance of compensated buffer 201, even though the output impedance may not necessarily match the line impedance of a line coupled to the output of compensated buffer 201.

It is appreciated that the present invention may be useful during the characterization stage of a chip before the chip is mass produced to determine optimum performance. For instance, a test program may be written to operate the chip with various compensation control signal values externally loaded into compensation signal memory location 229. External compensation control signals 225 may be written into compensation signal memory location 229 and the chip may then be tested for maximum performance for each particular external compensation control signal 225 value. After a range of external compensation control signal 225 values and corresponding maximum chip speeds have been identified for each particular external compensation control signal 225 value, the ideal value for the external reference resistor R1 may be identified. An external reference resistor R1 having the identified ideal resistance value may then be used when the chip is mass produced so that compensation unit 221 is calibrated to generate the optimum local compensation control signal 223 value for ideal chip performance. It is appreciated that there may be a variety of other uses of external writes to the compensation control signal memory location 229 beyond the scope of the present invention, which include input/output loop back testing, source synchronous switching, or the like.

In another embodiment, a test program may be written to sequentially verify the proper functionality of each of the compensation devices (not shown) included in compensated buffer 201. In that embodiment, various compensation control signal values that individually activate compensation devices in compensated buffer 201 are externally loaded into compensation signal memory location 229. Proper functionality of each compensation device may then be verified as each compensation device in compensated buffer 201 is separately activated. This testing technique is described in greater detail in co-pending application Ser. No. 08/823,215, filed Mar. 24, 1997, entitled, "Method and Apparatus for Testing Compensated Buffer Circuits," and assigned to the assignee of the present invention.

Thus, what has been described is a method and an apparatus for controlling a compensated buffer circuit. In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A compensated input/output buffer control circuit, comprising:
    a compensation unit configured to generate a local compensation control signal for controlling a compensated input/output buffer;
    a compensation signal memory location coupled to the compensation unit;
    an external compensation control signal for controlling the compensated input/output buffer, the compensation signal memory location coupled to be received by and stored with the external compensation control signal; and
    a selection circuit coupled to the compensation unit and the compensation signal memory location, the selection circuit configured to select between the local compensation control signal and the external compensation control signal, the selection circuit generating an output compensation control signal coupled to be received by the compensated input/output buffer.

2. The compensated input/output buffer control circuit described in claim 1 wherein the compensation signal memory location is further coupled to be selectively loaded with either the local compensation control signal or the external compensation control signal.

3. The compensated input/output buffer control circuit described in claim 2 wherein the compensation signal memory location is selectively loaded with either the local compensation control signal or the external compensation control signal in response to an external select signal.

4. The compensated input/output buffer control circuit described in claim 3 wherein the selection circuit includes a first multiplexor coupled to receive the local compensation control signal and the external compensation control signal, the first multiplexor loading the compensation signal memory location in response to the external select signal.

5. The compensated input/output buffer control circuit described in claim 4 wherein the selection circuit further includes a second multiplexor coupled to receive an output of the compensation signal memory location and the local compensation control signal, the second multiplexor generating the output compensation control signal in response to a select bit output by the compensation signal memory location.

6. The compensation input/output buffer control circuit described in claim 2 further comprising a compensation signal memory location output enabling an external read of the compensation signal memory location.

7. The compensation input/output buffer control circuit described in claim 1 wherein the compensation unit memory location comprises a plurality of bit memory locations.

8. A method for controlling a compensated input/output buffer, the method comprising the steps of:

generating a local compensation control signal with a compensation unit;

receiving an external compensation control signal storing the external compensation control signal in a compensation unit memory location;

selecting between the local compensation control signal of the compensation unit and the compensation unit memory location; and generating an output compensation control signal in response to the step of selecting between the local compensation control signal from the compensation unit and the compensation unit memory location, the output compensation control signal coupled to be received by the compensated input/output buffer.

9. The method described in claim 8 including the additional step of selectively storing the local compensation control signal in the compensation unit memory location.

10. The method described in claim 9 wherein the step of selecting between the local compensation control signal from the compensation unit and the compensation unit memory location is performed in response to a select bit included in the compensation unit memory location.

11. The method described in claim 9 including the additional step of reading the compensation unit memory location to determine a content of the compensation unit memory location.

12. A compensated input/output buffer control circuit, comprising:

first generation means for generating a local compensation control signal to control the compensated input/output buffer;

receiving means for receiving an external compensation control signal;

storage means for storing the external compensation control signal;

selection means for selecting between the local compensation control signal of the first generation means and the storage means; and second generation means for generating an output compensation control signal to be received by the compensated input/output buffer in response to the selection means.

13. The compensated input/output buffer control circuit described in claim 12 wherein the storage means includes means for selectively storing the local compensation control signal.

14. The compensation input/output buffer described in 12 further comprising reading means for reading a content of the storage means.

* * * * *